SEMICONDUCTOR GROWTH ON DIELECTRIC SUBSTRATES

Filed May 29, 1967

INVENTORS
Don M. Jackson Jr.
James A. Norling
BY
Mueller, Aichele & Rauner
ATTYS.

United States Patent Office 3,496,037

Patented Feb. 17, 1970

3,496,037

SEMICONDUCTOR GROWTH ON DIELECTRIC SUBSTRATES

Don M. Jackson, Jr., Scottsdale, and James A. Norling, Tempe, Ariz., assignors to Motorola, Inc., Franklin Park, Ill., a corporation of Illinois Filed May 29, 1967, Ser. No. 641,751

Int. Cl. H01l 7/62

U.S. Cl. 148—175 6 Claims

ABSTRACT OF THE DISCLOSURE

Improved hetero-epitaxial growth of silicon and germanium on sapphire is achieved by initiating nucleation and growth from silane at 900° C. and from germane at 600° C. After the initial nucleation and growth of a film having a thickness of at least 0.2 micron, continued growth is advantageously carried out at normal temperatures for epitaxial processes, i.e., above 1000° C. for the growth of silicon, and above 700° C. for the growth of germanium. Also, silicon tetrachloride and germanium tetrachloride, or other suitable compounds, may be substituted for the silane and germane, respectively, after the initial nucleation and growth have formed a suitable high quality monocrystalline film. The resulting epitaxial wafers are used in the fabrication of integrated circuits to provide dielectric isolation between discrete active semiconductor components.

BACKGROUND

This invention relates generally to the processing of semiconductive materials, and to the fabrication of semiconductor structures for use in the assembly of transistors, rectifiers, integrated circuits, and other semiconductor devices. A method is provided for the gas phase hetero-epitaxial deposition and growth of monocrystalline silicon and germanium on a dielectric substrate, including sapphire, for example.

Monolithic silicon integrated circuits with PN junction isolation represent the most intensively developed class of integrated circuits. They are attractive because of their high reliability and low cost due to the inherent advantage of careful control which can be readily achieved with the batch fabrication processes conventionally used for their manufacture. These circuits do suffer a significant disadvantage, however, due to problems associated with PN junction isolation.

A variation of the monolithic integrated circuit has recently been developed to provide dielectric isolation surrounding separate semiconductor islands containing both active and passive circuit components of the integrated structure. But the additional processing required to achieve electrical insulation by dielectric isolation has resulted in substantially higher cost.

Hybrid integrated circuits in which separate component parts are bonded to a ceramic substrate and interconnected by means of very light gage wire are a useful and versatile alternate approach to the problem of obtaining electrical isolation between discrete components. However, the hybrid technique will probably remain adaptable only to small volume custom circuit demands because of its substantially higher cost. Hybrid circuits are not amenable to batch processing as effectively as the monolithic circuits.

The industry has recently found that the growth of monocrystalline silicon on sapphire substrates may make possible a combination of the best features of silicon monolithic circuits with the best features of hybrid circuits. That is, it may be possible to produce an integrated circuit having the isolation characteristics of the hybrid circuits and which can be fabricated with the same batch processing methods as developed for silicon monolithic integrated circuits.

Considerable difficulty has been experienced, however, in the effort to obtain high quality monocrystalline epitaxial silicon on sapphire substrates. Even when using the highest quality single-crystal synthetic sapphire, polished to provide the smoothest possible surface, it has been virtually impossible to deposit a monocrystalline silicon film completely free of significant defects in crystal structure.

THE INVENTION

Accordingly, it is an object of the present invention to improve the nucleation and growth of very high quality silicon and germanium films on single-crystal sapphire substrates. It is a further object of the invention to provide improved technology for the fabrication of integrated circuits from epitaxial wafers consisting of monocrystalline silicon or germanium on sapphire.

In accordance with one feature of the invention, it has been found that the highest quality epitaxial films of silicon and germanium on sapphire can be achieved only when using the silicon and germanium hydrides, silane and germane, respectively, as a source of semiconductor material. The use of silicon tetrachloride or germanium tetracholride has been found substantially inferior to the hydrides. Similarly, trichlorosilane has been found unsuitable.

In accordance with a second critical feature of the invention, it has been found essential to initiate the nucleation and growth of silicon and germanium films on sapphire at temperatures substantially below the range of temperatures generally recognized to provide commercially acceptable growth rates. That is, when initiating the nucleation and growth of silicon it is essential that the silane be passed in contact with sapphire substrates maintained at a temperature within the range 850° C. to 970° C. When initiating the nucleation and growth of germanium, it has been found essential that the germane be charged in contact with sapphire substrates maintained within the range 550° C. to 670° C. All temperature limitations of the present disclosure refer to direct readings of infrared or optical pyrometers, and are uncorrected for emissivity or window absorption.

Once a stabilized growth of monocrystalline semiconductor film has been achieved, subsequent growth is continued using elevated temperatures and, if desired, using other sources of semiconductive material, such as the silicon and germanium tetrachlorides and trichlorosilane or trichlorogermane.

The invention is embodied in a method for the nucleation and growth of monocrystalline semiconductor material on sapphire which comprises exposing sapphire to a gaseous semiconductor compound selected from the group consisting of silane and germane, while maintaining the sapphire at a temperature within the range of 850° C. to 970° C. for silane and 550° C. to 670° C. for germane.

The above stated temperature ranges are well below the temperatures generally found suitable heretofore for epitaxial growth. Actually, the growth rates at these temperatures are too slow to be commercially feasible if it were contemplated that the complete epitaxial layer should be grown at these temperatures. In accordance with the present invention, once the initial nucleation and growth of monocrystalline semiconductor has proceeded to a thickness of at least 0.2 micron, sufficient to provide a near-perfect monocrystalline base for subsequent growth, the substrate temperature is raised to provide commercially feasible growth rates in accordance with known technology.

The substrates used in accordance with the invention are extremely high purity, commercially available, single-crystal synthetic sapphire. Best results are obtained using a crystallographic orientation to provide ($\bar{1}012$) plane for silicon or germanium growth. Other sapphire crystal planes may also be used.

The substrates may be precleaned by heating to 1300° C. for about five minutes in a hydrogen stream to remove all possible surface contamination. Preferably, the substrates are subjected to gas phase etching with chlorine trifluoride as a means of cleaning and polishing the surfaces for epitaxial growth. Suitable etching conditions include a temperature of 1200° C. and a 40-liters per minute flow of $H_2$ containing about 0.25% by volume $ClF_3$. The wafers are then cooled below 970° C. for silicon growth, and below 670° C. for germanium growth, as noted above. The silane or germane in hydrogen is then passed in contact with the heated wafers, the typical ratio of hydrogen to silane or germane being about 800 to 1 by volume.

Ten minutes growth at the lower temperatures is generally sufficient to grow no more than about 1 micron of epitaxial thickness. Considerably shorter times are suitable, so long as at least a 0.2 micron film is grown at the lower temperature. This is a sufficient thickness for the purpose of examination to determine that a perfect monocrystalline nucleation and growth is being obtained. At this point it will usually be preferred to increase the substrate temperature for the purpose of increasing the growth rate of the epitaxial film. Subsequent growth to any desired thickness is carried out at the temperatures and conditions characteristic of the prior art.

Specifically, in the case of silicon growth, it is commonly known to carry out epitaxial growth within the temperature range 1000° C. to 1300° C. by exposing heated substrates to a flowing gaseous mixture of silicon tetrachloride, trichlorosilane, or silane contained in an excess of inert gas which serves as a diluent and carrier. The carrier gas is usually hydrogen, although nitrogen or helium, for example, may be used. The concentration of silicon compound in the carrier gas is generally less than 1%, typically from 0.1% to 0.3% by volume. In order to dope the epitaxial layer as it grows, an impurity compound such as a hydride may be added to the carrier gas along with the semiconductor compound. Suitable hydrides include phosphine, diborane, and arsine.

When growing epitaxial germanium, the substrate temperature is generally maintained with the range 700° C. to 850° C. Similarly as with silicon growth, the heated wafers are exposed to a gaseous mixture of a carrier gas containing as little as 0.1% by volume of germanium tetrachloride, trichlorogermane, or germane. Appropriate trace amounts of phosphine, diborane, or arsine, for example, may be included as dopants.

DRAWINGS

Figures 1, 5:
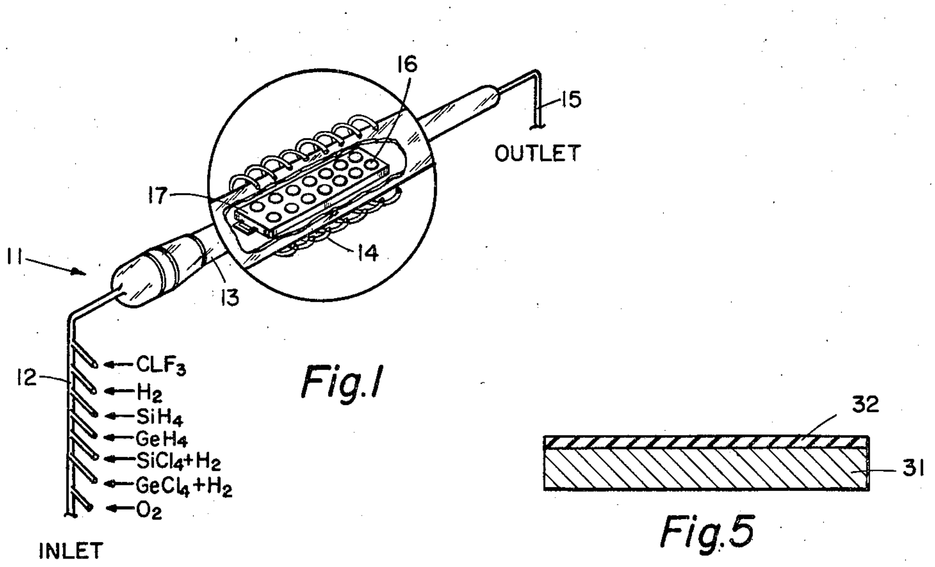
FIG. 1 is a diagrammatic representation of an RF induction coil furnace suitable for use as a reaction chamber in growing the epitaxial films of the invention.
FIGS. 5 through 8 are enlarged cross-sectional views representing an alternate sequence of processing steps for the fabrication of a suitable wafer structure to be used in the manufacture of integrated circuits.

In FIG. 1 epitaxial furnace 11 consists of inlet line or lines 12, quartz tube 13, RF induction coils 14, and outlet line 5. Sapphire wafers 16 are mounted on graphite susceptor 17 for placement within the furnace area surrounded by coils 14.

Figure 2:
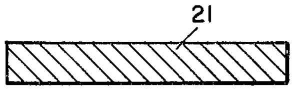
FIGS. 2–4 are enlarged cross-sectional views showing a synthetic sapphire substrate and stages of its modification in accordance with one embodiment of the invention.
Figure 6:
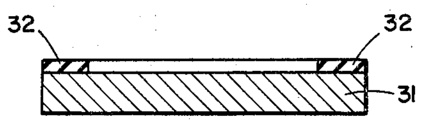
Figure 3:
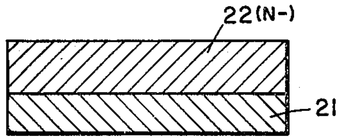

As an example of a processing sequence whereby an effectively isolated region of epitaxial silicon or germanium on sapphire is produced, the wafer of single crystal synthetic sapphire illustrated in FIG. 2 is processed in accordance with the invention to provide an epitaxial layer of monocrystalline semiconductor material of N-type conductivity as illustrated in FIG. 3. Typically, sapphire substrate 21 has a thickness of about 10 mils and is crystallographically oriented to provide a ($\bar{1}012$) or other suitable plane for epitaxial growth of semiconductor layer 22 which will usually have a thickness of from 0.1 to 10 microns.

Figure 4:
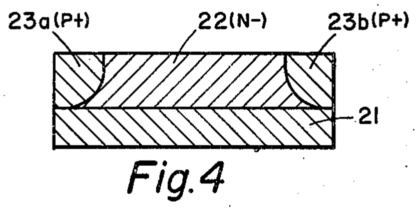

Subsequently, as illustrated in FIG. 4, isolated regions of semiconductor material are provided by NP+ junction isolation by means of P+ diffused regions **23*a* and 23*b*** produced by the diffusion of boron, for example, in accordance with known techniques.

FIGS. 5 through 8 illustrate an alternate sequence of processing steps suitable to provide a semiconductor wafer suitable for the fabrication of isolated electrical component regions on a sapphire substrate. As illustrated in FIG. 5, the first step of this sequence involves the vapor deposition of silicon dioxide layer 32 upon sapphire substrate 31. The silicon dioxide layer is deposited by known techniques involving the reaction of oxygen gas and silicon tetrachloride, or the decomposition of ethyl orthosilicate. Typically, the layer should be grown to a thickness of from 0.1 to 10 microns.

Figure 7:
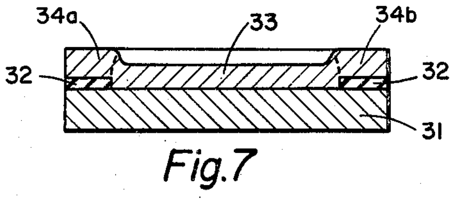

Thereafter, by conventional photoresist and etching techniques, selected areas of the silicon dioxide layer are removed to provide spaces for the subsequent heteroepitaxial growth of monocrystalline semiconductor material in accordance with the present invention. FIG. 7 illustrates the results of growing semiconductor material on the modified substrate of FIG. 6. Region 33 is uniformly monocrystalline as a result of initiating nucleation and growth at a temperature below 970° C. for silicon and below 670° C. for germanium, in accordance with the invention. Regions **34*a* and 34*b*** are polycrystalline since the monocrystalline semiconductive material does not nucleate upon the silicon dioxide layer.

Figure 8:
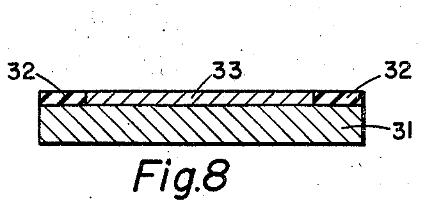

The modified structure of FIG. 7 is subjected to conventional mechanical lapping and polishing steps to produce a finished wafer as illustrated in FIG. 8. Semiconductor region 33 remains after the substantially complete removal of polycrystalline regions **34*a* and 34*b*. Region 33** is then utilized for the fabrication of circuit components in accordance with known techniques.

We claim:

1. A method for the nucleation and growth of monocrystalline semiconductive material on a sapphire subsrate which comprises exposing said sapphire to a gaseous semiconductor compound selected from the group consising of silane and germane, while maintaining the sapphire at a temperature within the range 850° C. to 970° C. for silane and 550° C. to 670° C. for germane.

2. A method as defined by claim 1 including the steps of increasing the temperature of the sapphire, after the deposition of at least 0.2 micron of semiconductive material, to at least 1000° C. for silicon and to at least 700° C. for germanium, and continuing the deposition of semiconductor material at the higher temperature.

3. A method as defined by claim 1 including a preliminary step of cleaning and polishing the sapphire by gas-phase etching with $ClF_3$.

4. A method as defined by claim 1 wherein said sapphire is crystallographically oriented to provide a ($\bar{1}012$) plane for epitaxial growth.

5. A method as defined by claim 1 wherein said semiconductor material is doped during growth, and including the further step of forming a plurality of heavily doped regions of opposite conductivity type in the grown layer to provide an array of junction-isolated semiconductor regions.

6. A method as defined by claim 1 wherein a surface of said substrate is initially provided with a network layer of vapor-deposited dielectric material thereby leaving isolated areas of exposed substrate surface for the nucleation and growth of semiconductive material, and including the additional step of subsequently lapping and polishing away excess grown semiconductor material to provide an isolated array of semiconductor islands for the fabrication of devices.

References Cited

UNITED STATES PATENTS

| | | | |
|---|---|---|---|
| 3,392,056 | 7/1968 | Maskalick | 117—227 |
| 3,393,088 | 7/1968 | Manasevit et al. | 117—106 |
| 3,413,145 | 11/1968 | Robinson et al. | 117—201 |

OTHER REFERENCES

R. L. Nolder et al., Journal of Applied Physics, vol. 36, No. 11, pp. 3444–50 (1965).

D. J. Dumin, Journal of Applied Physics, vol. 36, No. 9, pp. 2700–03 (1965).

J. M. Blank et al., Trans. Methallurgical Soc. Aime, vol. 236, pp. 291–4 (March 1966).

L. DEWAYNE RUTLEDGE, Primary Examiner

W. G. SABA, Assistant Examiner

U.S. Cl. X.R.

23—223.5; 117—107.2, 106, 201, 212; 148—1.5; 317—234, 235